United States Patent
Keramat et al.

(10) Patent No.: US 9,191,019 B2
(45) Date of Patent: Nov. 17, 2015

(54) DISTRIBUTED GAIN STAGE FOR HIGH SPEED HIGH RESOLUTION PIPELINE ANALOG TO DIGITAL CONVERTERS

(71) Applicant: Apple Inc., Cupertino, CA (US)

(72) Inventors: Mansour Keramat, San Jose, CA (US); Friedel Gerfers, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/658,333

(22) Filed: Mar. 16, 2015

(65) Prior Publication Data

US 2015/0263745 A1  Sep. 17, 2015

Related U.S. Application Data

(60) Provisional application No. 61/953,911, filed on Mar. 16, 2014.

(51) Int. Cl.
| | |
|---|---|
| *H03M 1/66* | (2006.01) |
| *H03M 1/08* | (2006.01) |
| *H03M 1/00* | (2006.01) |
| *H03M 1/70* | (2006.01) |
| *H03M 1/36* | (2006.01) |
| *H03M 1/12* | (2006.01) |

(52) U.S. Cl.
CPC .............. *H03M 1/08* (2013.01); *H03M 1/002* (2013.01); *H03M 1/1245* (2013.01); *H03M 1/36* (2013.01); *H03M 1/70* (2013.01)

(58) Field of Classification Search
CPC ..... H03M 1/164; H03M 1/002; H03M 1/167; H03M 1/007; H03M 1/1057; H03M 1/1225; H03M 1/70; H03M 1/1245; H03M 1/442; H03M 1/08; H03M 1/36; H03M 1/466; H03M 1/12; H03M 2201/847
USPC ........................... 341/161, 155, 144; 708/819
See application file for complete search history.

(56) References Cited

U.S. PATENT DOCUMENTS

| | | | |
|---|---|---|---|
| 6,448,911 B1 | 9/2002 | Somayajula | |
| 6,768,440 B1 | 7/2004 | Troutman | |
| 7,068,202 B2 * | 6/2006 | Waltari | 341/155 |
| 7,265,705 B1 | 9/2007 | Lee et al. | |
| 7,903,017 B2 * | 3/2011 | Hsieh et al. | 341/161 |
| 7,941,475 B2 * | 5/2011 | Bagheri et al. | 708/819 |
| 8,537,046 B2 | 9/2013 | Zhao et al. | |
| 8,629,797 B2 | 1/2014 | Gotoh | |
| 2005/0117071 A1 * | 6/2005 | Johnson | 348/729 |
| 2008/0238753 A1 * | 10/2008 | Dura et al. | 341/155 |
| 2011/0298645 A1 * | 12/2011 | Bales | 341/161 |

* cited by examiner

*Primary Examiner* — Jean B Jeanglaude
(74) *Attorney, Agent, or Firm* — Meyertons, Hood, Kivlin, Kowert & Goetzel, P.C.; Lawrence J. Merkel

(57) ABSTRACT

In an embodiment, multiple MDAC stages are coupled in parallel to form an MDAC having the desired gain and capacitor size. Each stage may include capacitors and an OTA that are much smaller than the corresponding capacitors and OTA would be for a large single stage. Interconnect for each stage may be shorter than the single stage case, and thus the parasitic resistance and capacitance may be lower. Power consumption may be reduced, and performance of the amplifier may be increased, due to the reduced parasitic resistance and capacitance. The area occupied by the circuitry may be lower as well. Process variation within a given stage may be lower. The process variation between stages may induce noise in the output, but the parallel connection of the stages may serve to reduce the noise, in some embodiments.

20 Claims, 3 Drawing Sheets

DISTRIBUTED GAIN STAGE FOR HIGH SPEED HIGH RESOLUTION PIPELINE ANALOG TO DIGITAL CONVERTERS

This application claims benefit of priority to U.S. Provisional Patent Application Ser. No. 61/953,911, filed on Mar. 16, 2014, which is incorporated herein by reference. To the extent that anything in the incorporated material conflicts with the material expressly set forth herein, the expressly set forth material controls.

BACKGROUND

1. Technical Field

Embodiments described herein are related to analog to digital converters (ADCs), and more particularly to amplifiers included in ADCs.

2. Description of the Related Art

High-speed, high resolution pipelined ADCs employ large sampling capacitance to meet the stringent noise requirements demanded in communication systems like Long Term Evolution (LTE). One type of ADC which may be used in such systems is a multiplying digital to analog converter (MDAC) operational transconductance amplifier (OTA). The MDAC OTA drives large sampling and feedback capacitors, and thus itself is large. The relative distance between the components increases as the size of each increases, which increases parasitic interconnect resistance and capacitance. As sampling rates in the ADCs increase, the settling time of the MDAC increases as well, further exacerbated by the parasitic resistance and capacitance. The relatively large size of the OTA and the sampling/feedback capacitors also results in variations due to process gradients over the semiconductor area occupied by these components, impacting the overall ADC performance as well.

SUMMARY

In an embodiment, multiple MDAC stages are coupled in parallel to form an MDAC having the desired gain (transconductance) and capacitor size. Each stage may include capacitors and an OTA that are much smaller than the corresponding capacitors and OTA would be for a large single stage. Interconnects for each stage may be shorter than the single stage case, and thus the parasitic resistance and capacitance may be lower. Power consumption may be reduced, and performance of the amplifier may be increased, due to the reduced parasitic resistance and capacitance. The area occupied by the circuitry may be lower as well. Process variation within a given stage may be lower. The process variation between stages may induce noise in the output, but the parallel connection of the stages may serve to reduce the noise, in some embodiments.

BRIEF DESCRIPTION OF THE DRAWINGS

The following detailed description makes reference to the accompanying drawings, which are now briefly described.

Figure 1:
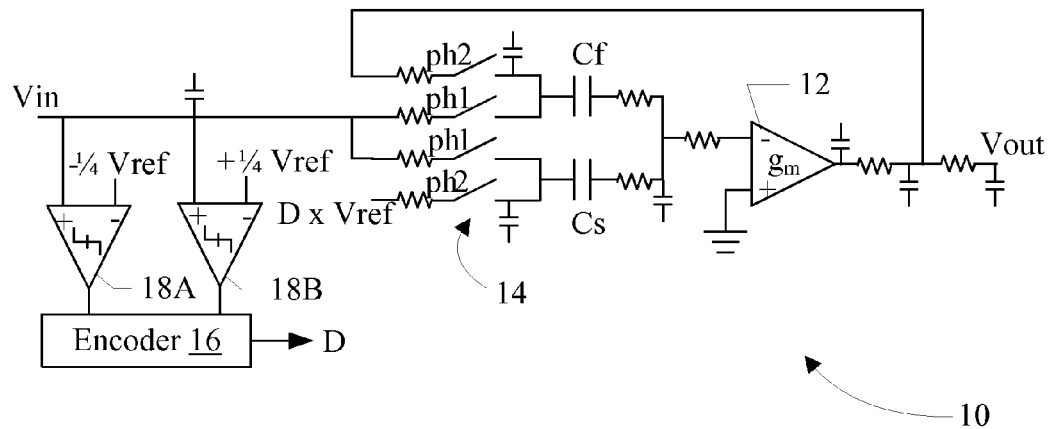
FIG. 1 is a circuit diagram of one embodiment of an ADC including an MDAC.

While embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed, but on the contrary, the intention is to cover all modifications, equivalents and alternatives falling within the spirit and scope of the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112(f) interpretation for that unit/circuit/component.

This specification includes references to "one embodiment" or "an embodiment." The appearances of the phrases "in one embodiment" or "in an embodiment" do not necessarily refer to the same embodiment, although embodiments that include any combination of the features are generally contemplated, unless expressly disclaimed herein. Particular features, structures, or characteristics may be combined in any suitable manner consistent with this disclosure.

DETAILED DESCRIPTION OF EMBODIMENTS

FIG. 1 is a block diagram illustrating one embodiment of an MDAC pipeline stage 10. In an embodiment, the MDAC pipeline stage 10 may be a 1.5 bit/stage pipeline stage. The MDAC pipeline stage 10 includes an OTA 12 having a gain $g_m$. The positive input of the OTA 12 is grounded, and the negative input of the OTA 12 is coupled to a terminal of a feedback capacitor Cf and a sampling capacitor Cs. The other terminal of each capacitor is coupled to switches 14. Particularly, each capacitor Cf and Cs is coupled to two switches in this embodiment: one that is closed in phase 1 (ph1) and the other that is closed in phase 2 (ph2). In some embodiments, ph1 and ph2 may be non-overlapping. That is, only one of the ph1 and ph2 switches may be closed at any given point in time. There may be times in which neither switch is closed, in some embodiments (e.g. non-overlapping clocks may be used for ph1 and ph2). The ph1 switches couple the terminal of each capacitor Cf and Cs to the input voltage Vin. Thus, ph1 may be the phase in which the sampling of the input voltage is occurring. In this embodiment, both the Cf and Cs capacitors are used as sampling capacitors. The ph2 switch of the capacitor Cf may couple the terminal of the capacitor Cf to the output of the OTA 12. Thus, the ph2 phase may be the feedback phase in which feedback of the MDAC stage 10 is occurring. During the feedback phase, the capacitor Cs is coupled to either +Vref (if D is +1), −Vref (if D is −1), or 0 volts (if D is 0). D is the output of an encoder 16.

In addition to the MDAC pipeline stage 10, the ADC may further include comparators 18A-18B and the encoder 16. The comparators 18A-18B may compare the analog voltage input to a specified fraction of a reference voltage (Vref). For example, the reference voltage may be a voltage above which the input voltage is defined to resolve to a digital one, and below which (on the negative side) the input voltage is defined to resolve to a digital zero. The specified fraction (¼ in this embodiment) may be selected as a tradeoff between noise (higher fractions may exhibit greater noise immunity) and rapid resolution (lower fractions may more rapidly resolve into digital values). While ¼ is used as the specified fraction in this embodiment, other embodiments may select higher or lower fractions as desired (e.g. ⅛, ⅜, 5/16, 3/16, etc.).

In the illustrated embodiment, the encoder 18A may compare the input voltage (Vin) to −¼ Vref, and may output a logical 0 if Vin is less than −¼ Vref and a logical one if Vin is greater than −¼ Vref (or vice versa). The encoder 18A may compare Vin to +¼ Vref, and may output a logical 0 if Vin is less than +¼ Vref and logical one if Vin is greater than +¼ Vref. The decoder is coupled to the outputs of the comparators 18A-18B and may be configured to generate D responsive to the outputs. Specifically, if the comparator 18A indicates that Vin is less than −¼ Vref, the encoder may generate D=−1. If the comparator 18B indicates that Vin is greater than +¼ Vref, the encoder may generate D=+1. Otherwise (Vin is between −¼ Vref and +¼ Vref), the encoder may generate D=0.

The resistors illustrated in FIG. 1, and the capacitors other than Cf and Cs, are parasitic resistors and capacitors. Most of the parasitic resistance and capacitance may result from the interconnect between the circuit components (e.g. the interconnect, or wiring, between the capacitors Cf and Cs, the OTA 12, etc.) For high speed, high resolution ADCs, the parasitic resistance and capacitance may become a dominant factor affecting performance of the ADCs. As an example: assume a 250 million samples per second (MSPS) ADC (time of sampling (Ts)=4.0 ns). After assigning 200 picoseconds (ps) for non-overlapping clocks to generate ph1 and ph2 and for the comparator decision described below, there are approximately 1.8 nanoseconds (ns) for settling of the MDAC. If ⅓ of the 1.8 ns is assigned for slewing and for a 16 bit ADC, a time constant (tau ($\tau$)) of 130 ps is calculated for the MDAC. In this example, a total sampling capacitance (Cf+Cs) of 4 picoFarads (pF) may be used, which means that the total switch and interconnect resistance has to be below 32 ohms to meet the time constant of 130 ps.

Figure 2:
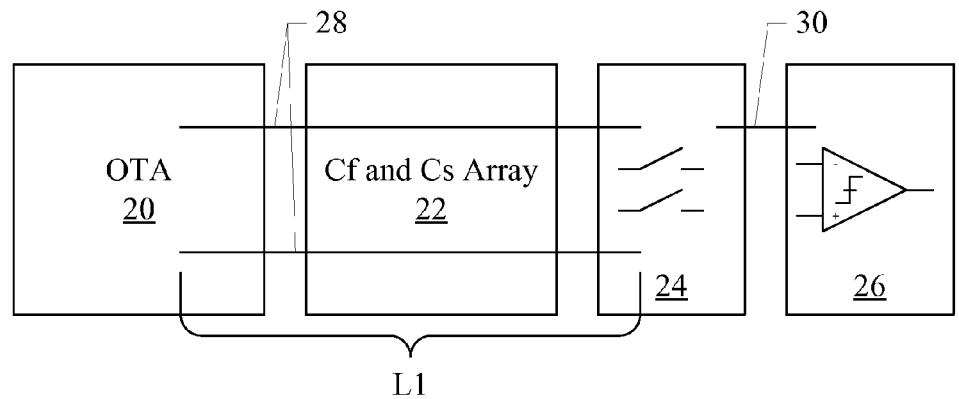
FIG. 2 is a block diagram of one embodiment of components of the circuit in FIG. 1 occupying an area in an integrated circuit.

FIG. 2 is a block diagram illustrating one embodiment of a physical arrangement of the components shown in the ADC of FIG. 1 in an area occupied by the ADC on an integrated circuit. The embodiment of FIG. 2 includes an OTA block 20 representing an area occupied by the OTA 12 in FIG. 1, a Cf and Cs array 22 representing the area occupied by the capacitors Cf and Cs, a switch block 24 representing the area occupied by the switches 14, and a comparator block 26 representing an area occupied by the comparators 18 and the encoder 16.

A capacitor array may be a circuit structure that permits various capacitances to be realized via changes to the wiring between the capacitor elements in the array. That is, the elements may contribute to the overall capacitance of the capacitor Cf and/or Cs through wiring the elements in series and/or parallel. Different amounts of capacitance may be used for different instantiations of the MDAC 10, in order to provide different ADCs in an integrated circuit. Accordingly, various capacitor elements in the array 22 may be connected to form the Cf capacitor in FIG. 1, and various other capacitor elements in the array 22 may be connected to form the capacitor Cs.

To realize the circuit illustrated in FIG. 1, the blocks 20, 22, 24, and 26 may be connected using wiring layers of the integrated circuit. In particular, to implement the MDAC 10, the OTA block 20, the Cf and Cs array 22, and the switches 24 may be connected using the wiring layers (represented by wiring 28 in FIG. 1). The comparator block 26 may also be connected to the switch block 24 to form the D×Vref connection shown in FIG. 1 (wiring 30).

The wiring length to form the connections for the MDAC 10 may be a length L1, and is in part dependent on the area occupied by the blocks 20, 22, and 24. These block sizes may be relatively large, which may lead to a relatively long length L1. The length L1 may be proportional to the parasitic resistance introduced by the wiring, for a given width of the wire. While the parasitic resistance may be reduced by widening the wires, the increased width may increase the parasitic capacitance, limiting the improvement that may be achieved by widening the wire. The length L1 of the wire may result in power consumption that is greater than desired, as well as limiting the performance of the MDAC from a timing perspective.

Figure 3:
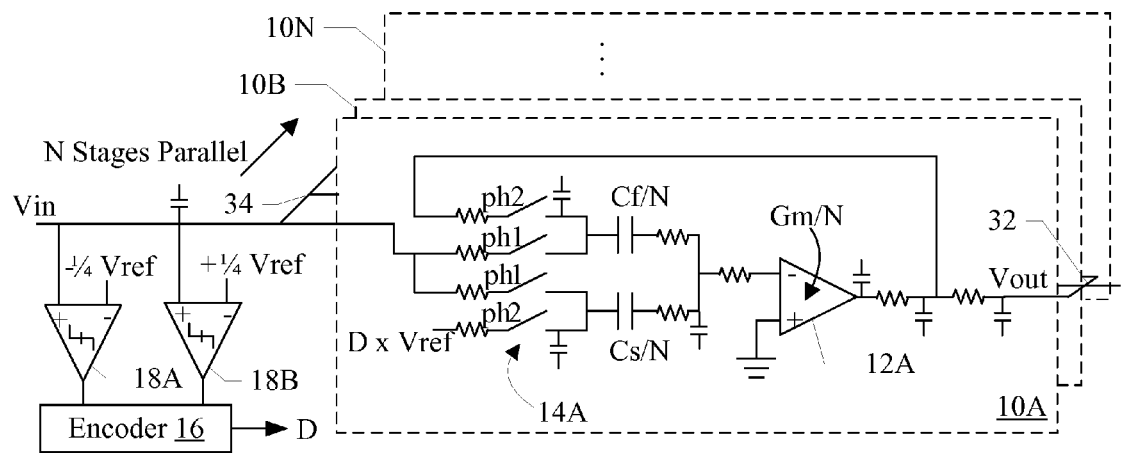
FIG. 3 is a circuit diagram of an embodiment of an ADC having multiple parallel stages of an MDAC.

Turning now to FIG. 3, a circuit diagram illustrating an embodiment of an ADC formed from multiple parallel MDAC stages 10A-10N is shown. The stages 10A-10N may be coupled in parallel to the input voltage Vin (e.g. illustrated as input voltage node 34 in FIG. 3) and coupled in parallel to the output voltage Vout (e.g. illustrated as output voltage node 32 in FIG. 3). There may be N parallel stages, where N is an integer greater than 1. The MDAC state 10A is illustrated in greater detail in FIG. 3 and includes switches 14A, feedback and sampling capacitors, and OTA 12A similar to the embodiment of FIG. 3. However, the OTA 12A has a gain $g_m/N$ as illustrated in FIG. 3. Additionally, the capacitances for the feedback and sampling capacitors are 1/N times the capacitances of FIG. 1 (illustrated as Cf/N and Cs/N in FIG. 3). Thus, the N parallel stages present a total gain (or transconductance) substantially equal to $g_m$ and total feedback and sampling capacitance of Cf and Cs. Accordingly, the N parallel stages may be the equivalent of the single stage shown in FIG. 1 in terms of MDAC functionality.

In the illustrated embodiment, the MDAC stages 10A-10N may share the same comparators 18A-18B and encoder 16. Thus, the MDAC stages 10A-10N may receive the same inputs. The MDAC stages 10A-10N may thus nominally output the same output voltage. However, because the MDAC stages 10A-10N are separate instantiations, manufacturing variations and other factors may cause noise variation among the MDAC stages 10A-10N. These noise variations may have the effect of partially canceling each other, which may reduce the noise experienced on the output compared to the embodiment of FIG. 1.

Figure 4:
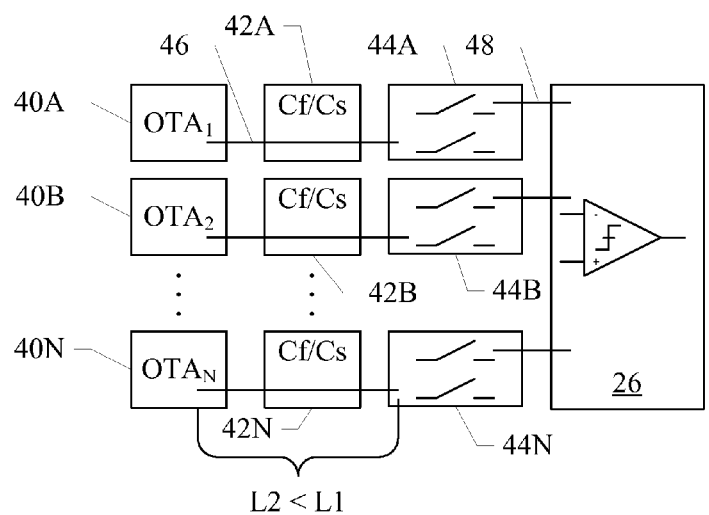
FIG. 4 is a block diagram of one embodiment of components of the circuit in FIG. 3 occupying an area in an integrated circuit.

The separation of the MDAC into parallel stages 10A-10N may reduce the area occupied by any one stage, and may permit shorter wiring lengths which may reduce the parasitic resistance and capacitance of each stage. FIG. 4 is one embodiment of a physical arrangement of the components shown in the ADC of FIG. 3 in an area occupied by the ADC on an integrated circuit. The embodiment of FIG. 4 includes multiple OTA blocks 40A-40N representing an area occupied by the OTA 12A in FIG. 3 and similar OTAs in other MDAC stages 10B-10N, respectively. The embodiment of FIG. 4 includes Cf and Cs arrays 42A-42N representing the area occupied by the feedback and capacitors in the stage 10A and similar capacitors in the other stages 10B-10N, respectively. The embodiment of FIG. 4 includes switch blocks 44A-44N representing the area occupied by the switches 14A and similar switches in other MDAC stages 10B-10N. The embodiment of FIG. 4 further includes the comparator block 26 representing the area occupied by the comparators 18A-18B and the encoder 16. Each OTA block 40A-40N may be physically located near (e.g. adjacent to) the corresponding capacitor array 42A-42N and the corresponding switch block 44A-44N. The OTA blocks 40A-40N, capacitor arrays 42A-42N, and switch blocks 44A-44N may be connected via wiring layers (e.g. wiring 46). The comparator block 26 may also be connected to the switch blocks 44A-44N to form the D×Vref connection shown in FIG. 1 (e.g. wiring 48).

Since the capacitances and OTAs for each parallel stage or reduced in size compared to the embodiment of FIG. 1, each OTA and corresponding capacitances may occupy significantly less area. Additionally, each OTA and its capacitances and switches may physically be located near (adjacent to) each other. The length of wiring between the OTAs, capacitances, and switches for each stage may be L2, which may be significantly shorter than (less than) L1. The reduced parasitic resistance and capacitance may improve both the performance in the power consumption of the ADC. Specifically, in an embodiment, the total area occupied by the combination of the N parallel stages may be less than the area occupied by the embodiment of FIG. 1, and the total power consumed in the N parallel stages may be less than the power consumed in the embodiment of FIG. 1. Blocks may be viewed as "adjacent to" each other if the blocks are placed in proximity, and other blocks are not placed between the adjacent blocks. There may be a minimum, technology-dependent spacing between the blocks. There may also be variations in the spacing due to manufacturing tolerances and variations.

In one embodiment, the devices in the OTAs 40A-40N and the capacitors in the arrays 42A-40N may match more closely, in view of manufacturing variations and the like, due to smaller device spreads and distances. In one embodiment, a smaller MDAC results in lower memory effect (input-output coupling).

Figure 5:
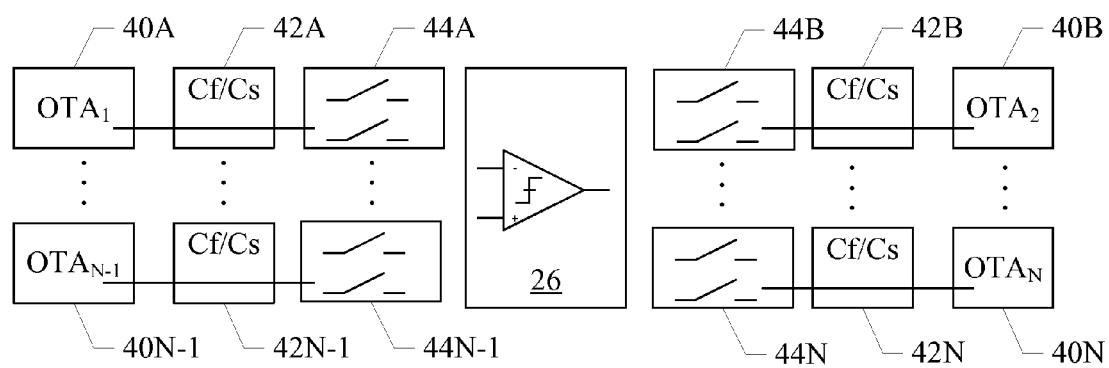
FIG. 5 is a block diagram of another embodiment of components of the circuit in FIG. 3 occupying an area in an integrated circuit.

The embodiment of FIG. 4 illustrates the OTA blocks 40A-40N, the capacitor arrays 42A-42N, and the switches 44A-44N may each be arranged in a line in one dimension of the plane of the integrated circuit surface (e.g. a "column" or a "row"). Other embodiments may use other arrangements. For example, a tiled arrangement may be used. An embodiment of such an arrangement is shown in FIG. 5. The blocks 40A-40N, 42A-42N, and 44A-44N are tiled around the comparator block 26, for example.

As used in this description, "substantially" or "substantially equal" or similar phrases may be used to indicate that the values are very close or similar. Since two physical entities may not generally be exactly equal, a phrase such as "substantially equal" is used to indicate that they are for all practical purposes equal. Similarly, "nominally" may be used to refer to "as designed," where actual instances may be expected to have some variation from the nominal due to manufacturing variations, etc.

Numerous variations and modifications will become apparent to those skilled in the art once the above disclosure is fully appreciated. It is intended that the following claims be interpreted to embrace all such variations and modifications.

What is claimed is:

1. An apparatus comprising:
   a plurality of capacitors including one or more feedback capacitors and one or more sampling capacitors; and
   a plurality of operational transconductance amplifiers (OTAs), each OTA of the plurality of OTAs coupled to respective feedback and sampling capacitors of the plurality of capacitors to form one of a plurality of multiplying digital to analog converter (MDAC) stages, the plurality of MDAC stages coupled in parallel between an input voltage node and an output voltage node of the MDAC stages.

2. The apparatus as recited in claim 1 wherein each OTA is physically located adjacent to respective feedback and sampling capacitors.

3. The apparatus as recited in claim 2 wherein the plurality of OTAs are arranged in a line in one dimension of an integrated circuit on which the apparatus is realized.

4. The apparatus as recited in claim 2 wherein the plurality of OTAs are tiled on at least two sides of a block of shared circuitry.

5. The apparatus as recited in claim 4 wherein the respective feedback and sampling capacitors are instantiated between each OTA and the block of shared circuitry.

6. The apparatus as recited in claim 1 further comprising a pair of comparators of the input voltage to a reference voltage and a decoder coupled to outputs of the pair of comparators, wherein the comparators and decoder are shared among the plurality of MDAC stages.

7. The apparatus as recited in claim 6 wherein a first comparator of the pair is configured to compare the input voltage to a positive, specified fraction of the reference voltage and a second comparator of the pair is configured to compare the input voltage to a negative, specified fraction of the reference voltage.

8. The apparatus as recited in claim 7 wherein the decoder is configured to decode the outputs of the comparators into:
   −1 responsive to the input voltage being less than the negative, specified fraction of the reference voltage;
   +1 responsive to the input voltage being greater than the positive, specified fraction of the reference voltage; or
   0 responsive to the input voltage being greater than the negative, specified fraction of the reference voltage and less than the positive, specified fraction of the reference voltage.

9. The apparatus as recited in claim 8 wherein a decoded output of the decoder multiplied by the reference voltage is switched into the sampling capacitors during a feedback phase of the plurality of MDAC stages.

10. An apparatus comprising:
    a plurality of capacitor arrays, each of the plurality of capacitor arrays including one or more feedback capacitors and one or more sampling capacitors; and
    a plurality of operational transconductance amplifiers (OTAs), each OTA of the plurality of OTAs coupled to a respective one of the plurality of capacitor arrays to form one of a plurality of multiplying digital to analog converter (MDAC) stages, the plurality of MDAC stages coupled in parallel between an input voltage node and an output voltage node of the MDAC stages.

11. The apparatus as recited in claim 10 wherein each OTA is physically located adjacent to the respective capacitor array.

12. The apparatus as recited in claim 11 wherein the plurality of OTAs are arranged in a line in one dimension of an integrated circuit on which the apparatus is realized.

13. The apparatus as recited in claim 11 wherein the plurality of OTAs are tiled on at least two sides of a block of shared circuitry.

14. The apparatus as recited in claim 13 wherein the respective capacitor arrays are instantiated between each OTA and the block of shared circuitry.

15. The apparatus as recited in claim 10 further comprising a pair of comparators of the input voltage to a reference voltage and a decoder coupled to outputs of the pair of comparators, wherein the comparators and decoder are shared among the plurality of MDAC stages.

16. An analog to digital converter (ADC) comprising:
a plurality of multiplying digital to analog converter (MDAC) stages coupled in parallel, wherein each of the plurality of MDAC stages includes an operational transconductance amplifier (OTA) having a gain, a sampling capacitor, and a feedback capacitor, wherein a number of the plurality of MDAC states (N) is an integer greater than one, and wherein the gain of the OTA is 1/N of a desired gain of the MDAC formed from the plurality of MDAC stages, and wherein a capacitance of the feedback capacitor is 1/N of a desired feedback capacitance of the MDAC, and wherein a capacitance of the sampling capacitor is 1/N of a desired sampling capacitance of the MDAC; and
a pair of comparators and decoder that are shared between the plurality of MDAC stages, wherein the pair of comparators are configured to compare an input voltage of the MDAC to positive and negative fractions of a reference voltage and to output a multiplier for a reference voltage coupled to the sampling capacitor during a feedback phase of the MDAC.

17. The ADC as recited in claim 16 wherein an output voltage of the plurality of MDAC stages is an output of the ADC.

18. The ADC as recited in claim 16 wherein an output voltage of the plurality of MDAC stages is coupled to a first terminal of the feedback capacitors in each of the plurality of MDAC stages during the feedback phase, wherein a second terminal of a given feedback capacitor in a given stage of the plurality of MDAC stages is coupled to a negative input of OTA in the given stage.

19. The ADC as recited in claim 18 wherein the sampling capacitor has a third terminal coupled to the reference voltage multiplied by the multiplier during the feedback phase, and wherein a fourth terminal of the sampling capacitor in the given stage is coupled to the negative input to the OTA in the given stage.

20. The ADC as recited in claim 19 wherein the first terminal and the third terminal are coupled to the input voltage during a sampling phase of the MDAC.

* * * * *